United States Patent
Ling et al.

(10) Patent No.: US 6,445,069 B1
(45) Date of Patent: Sep. 3, 2002

(54) ELECTROLESS NI/PD/AU METALLIZATION STRUCTURE FOR COPPER INTERCONNECT SUBSTRATE AND METHOD THEREFOR

(75) Inventors: Jamin Ling, Scottsdale; Dave Charles Stepniak, Phoenix, both of AZ (US)

(73) Assignee: Flip Chip Technologies, L.L.C., Phoenix, AZ (US)

( * ) Notice: Subject to any disclaimer, the term of this patent is extended or adjusted under 35 U.S.C. 154(b) by 0 days.

(21) Appl. No.: 09/766,798

(22) Filed: Jan. 22, 2001

(51) Int. Cl.[7] ............................................... H01L 23/48
(52) U.S. Cl. ....................................... 257/738; 257/762
(58) Field of Search .................................. 257/738, 762, 257/778, 797, 737; 438/107, 614, 15

(56) References Cited

U.S. PATENT DOCUMENTS

| | | |
|---|---|---|
| 4,808,769 A | 2/1989 | Nakano et al. |
| 4,857,671 A | 8/1989 | Nakano et al. |
| 4,970,571 A | 11/1990 | Yamakawa et al. |
| 5,212,138 A | 5/1993 | Krulik et al. |
| 5,291,374 A | 3/1994 | Hirata et al. |
| 5,380,560 A | 1/1995 | Kaja et al. |
| 5,656,858 A * | 8/1997 | Kondo et al. ............... 257/737 |
| 5,747,881 A * | 5/1998 | Hosomi et al. ............. 257/762 |
| 5,766,979 A * | 6/1998 | Budnaitis ..................... 438/15 |
| 5,801,452 A * | 9/1998 | Farnworth et al. .......... 257/797 |
| 5,821,627 A | 10/1998 | Mori et al. |
| 5,906,312 A | 5/1999 | Zakel et al. |
| 5,937,320 A * | 8/1999 | Andricacos et al. ........ 438/614 |
| 6,008,543 A * | 12/1999 | Iwabuchi .................... 257/778 |
| 6,040,239 A | 3/2000 | Akram et al. |
| 6,049,130 A | 4/2000 | Hosomi et al. |
| 6,077,723 A * | 6/2000 | Farnworth et al. .......... 438/107 |
| 6,091,252 A | 7/2000 | Akram et al. |
| 6,094,058 A | 7/2000 | Hembree et al. |
| 6,097,087 A | 8/2000 | Farnworth et al. |

OTHER PUBLICATIONS

Jang, J.W., et al., Crystallization of Electroless Ni–P Under Bump Metallization Induced by Solder Reaction, Int. Symp. Adv. Pkg. Mat. 1999, pp. 252.

Stepniak, F., Solder Flip ChipsEmploying Electroless Nickel: An Evaluation of Reliability and Cost, Inter. PACK 1997.

Ostmann, A., et al., Electroless Metal Deposition for Back-End Wafer Processes, Advancing Microelectronics, p. 23.

Ulrich, R., et al., Thermosonic Gold Wirebonding to Electrolessly–Metallized Copper Bondpads over Benzocyclobutene, Int. Conf. High Density Pkg. and MCMs 1999, pp. 260.

O'Sullivan, E., et al., Electrolessly deposited diffusion barriers for microelectronics, IBM J.R.&D., vol. 42, No. 5—*Electrochemical microfabrication.*

HBS Technical Proposal #990505–2.0SH, "HBS Mark II Automatic Electroless Nickel/Immersion Gold Plate Tool," dated May 1999.

* cited by examiner

*Primary Examiner*—David Nelms
*Assistant Examiner*—Thinh Nguyen
(74) *Attorney, Agent, or Firm*—Cahill, Sutton & Thomas P.L.C.

(57) ABSTRACT

A nickel/palladium/gold metallization stack is formed upon connection pads of integrated circuits at the wafer level through an electroless plating method. The metallization stack can be formed over copper or aluminum interconnect pads; the lower nickel layer bonds securely to the copper or aluminum interconnect pads, while the intermediate palladium layer serves as a diffusion barrier for preventing the nickel from out-diffusing during subsequent thermal cycles. The upper gold layer adheres to the palladium and readily receives a variety of interconnect elements, including gold bumps, gold wire bonds, solder bumps, and nickel bumps. The electroless plating process permits connection pads to be formed using fine geometries, and allows adjacent connection pads to be formed within 5 micrometers of each other.

23 Claims, 1 Drawing Sheet

ELECTROLESS NI/PD/AU METALLIZATION STRUCTURE FOR COPPER INTERCONNECT SUBSTRATE AND METHOD THEREFOR

Manufacturers of semiconductor integrated circuits have been experimenting with the use of copper to form the interconnect metallization upon integrated circuits. Copper has much better conductivity than the traditional aluminum metallization that has been used in past years, and improved conductivity is essential to achieve higher speed operation.

Such integrated circuits typically have a series of electrical connection pads by which the integrated circuit can be electrically joined with other external circuitry. For example, wire bonds have long been used to electrically couple the connection pads of an integrated circuit to the leads of a package, or to a supporting substrate. Solder bumps are also a cost-effective, and convenient, method of electrically coupling integrated circuits to supporting substrates within an electronics system; such solder bumps are often formed on integrated circuit wafers of the type that are used in providing so-called flip chip integrated circuit packages and/or chip scale packages.

Traditional wire bond and solder bumping methods cannot be used reliably with integrated circuits using copper interconnect metallization. In the case of gold wire bonds, an interaction takes place between the gold of the gold wire bond and the very thin copper layer to which it is bonded, and this interaction degrades the performance and reliability of the copper layer. Likewise, in the case of solder balls, an interaction takes place between the Sn/Pb solder and the very thin copper layer to which the solder is applied, and this interaction similarly degrades the performance and reliability of the copper layer. In addition, solder bumps require a solder diffusion barrier between the solder and the final copper metal of the integrated circuit. Others have proposed the use of nickel to serve as a bridge and barrier between the copper and gold in various applications. However, in many cases, integrated circuit die must be thermal cycled either at the wafer level (i.e., prior to scribing the die), or at the individual die level (after the wafer is scribed and the die are "broken" apart from the wafer), before the integrated circuit is finally assembled. Such thermal cycling steps could include wire bonding, die attachment, and wafer-level bum-in used to detect marginal Ics. In some cases, such thermal cycling is conducted in order to eliminate defects within, and improve the performance of, transistors and other devices formed within such integrated circuits, as by releasing trapped charges from the semiconductor devices (FETs, etc.) that are part of the integrated circuits. The heating associated with such thermal cycling tends to cause the nickel material to diffuse outwardly into the gold wire or solder bump, and such outward diffusion weakens the joint between the gold wire bond, or the solder bump, and the integrated circuit connection pad.

As is well known, integrated circuits are typically fabricated from semiconductor wafers in which a relatively large number of such identical integrated circuits are fabricated at once. Once the wafer level processing of such semiconductor wafers is complete, the wafers are scribed and broken along the scribe lines to form individual integrated circuit die. Clearly, it is an advantage to perform required processes at the wafer level, rather than at the individual circuit die level, as costs are thereby minimized.

Accordingly, it is an object of the present invention to provide an integrated circuit structure at the wafer level which makes use of copper interconnect metallization while facilitating the electrical coupling of connection pads of the integrated circuits to supporting substrates or other packaging.

Another object of the present invention is to provide such an integrated circuit structure using known metal deposition processes in a simple and inexpensive manner.

Still another object of the present invention is to provide such an integrated circuit structure which is compatible with gold wire bonds, solder bumps, and other common circuit connection methods.

A further object of the present invention is to provide such an integrated circuit structure capable of permitting relatively tight spacings between adjacent connection pads without compromising the reliability of the integrated circuit.

Yet another object of the present invention is to provide a process for forming connection pads on a plurality of integrated circuit die formed in semiconductor wafer, wherein the process is compatible with copper interconnect metallization while facilitating the use of gold wire bonds, solder bumps, and other common methods for electrically interconnecting the electrodes of an integrated circuit to a supporting substrate or packaging.

These and other objects of the present invention will become more apparent to those skilled in the art as the description of the present invention proceeds.

SUMMARY OF THE INVENTION

Briefly described, and in accordance with a preferred embodiment thereof, the present invention relates to an integrated circuit structure that includes a semiconductor wafer having a number of integrated circuit die formed therein, each having a series of semiconductor devices formed therein upon one surface of the semiconductor wafer. A patterned layer of interconnect metal, preferably formed of copper, is formed upon the upper surface of the semiconductor wafer for electrically interconnecting the various semiconductor devices formed within each such die. The patterned interconnect metal layer includes connection pads for making electrical connection to external circuitry. A patterned layer of nickel is plated, preferably by an electroless plating process, over each connection pad for mechanically and electrically bonding to the interconnect metal forming such connection pad. A patterned layer of palladium is then plated, preferably by an electroless plating process, over the previously-applied layer of nickel above each connection pad for preventing the nickel from out-diffusing during subsequent thermal cycling to a patterned gold layer that is applied over the palladium layer. Thereafter, the patterned layer of gold is plated, again preferably by an electroless plating process, over the patterned layer of palladium above each connection pad to facilitate the joinder of such connection pad with a connection element, such as a gold wire bond, solder bump, or the like. The intermediate palladium layer acts as a diffusion barrier, and prevents the underlying nickel from diffusing into the uppermost gold layer.

The integrated circuit structure described above can be used to form relatively tight geometries, i.e., connection pads can be formed relatively close to each other without jeopardizing the reliability of the resulting integrated circuits. For example, integrated circuit structures made in this manner permit two adjacent connection pads to be disposed within 5 micrometers, or less, of each other.

In the preferred embodiment of the present invention, the Ni/Pd/Au metallization stack may have a nickel layer thickness ranging between 0.5 micrometers and 20 micrometers;

a palladium thickness ranging between 0.1 micrometers and 5 micrometers; and a gold layer thickness ranging between 0.03 micrometers and 2 micrometers.

Another aspect of the present invention relates to the process for forming such integrated circuit structure, and more particularly, to the process for forming the connection pads on the integrated circuit die during wafer level processing. The process includes the step of forming the patterned layer of interconnect metal upon a surface of the semiconductor wafer for electrically interconnecting the various semiconductor devices formed within each such integrated circuit die, as well as forming connection pads for making electrical connection to circuitry external to the semiconductor wafer. The process includes the step of forming a patterned layer of nickel by electroless plating over each connection pad for mechanically and electrically bonding to the interconnect metal at each such connection pad. Thereafter, the process forms a patterned layer of palladium by electroless plating over the patterned layer of nickel above each connection pad for preventing the nickel from out-diffusing through the palladium during subsequent heating cycles. Preferably, this palladium layer is plated directly onto the nickel layer without any intervening layer. A patterned layer of gold is then formed by electroless plating over the patterned layer of palladium above each connection pad to facilitate the joinder of such connection pad with a connection element, such as a solder bump or wire bond. This process permits connection pads to be disposed relatively closely to each other, e.g., within 5 micrometers of each other. If desired, the process may further include a thermal cycle heating step without causing the nickel layer to out-diffuse into the gold layer.

DETAILED DESCRIPTION OF THE PREFERRED EMBODIMENTS

Figure 1:
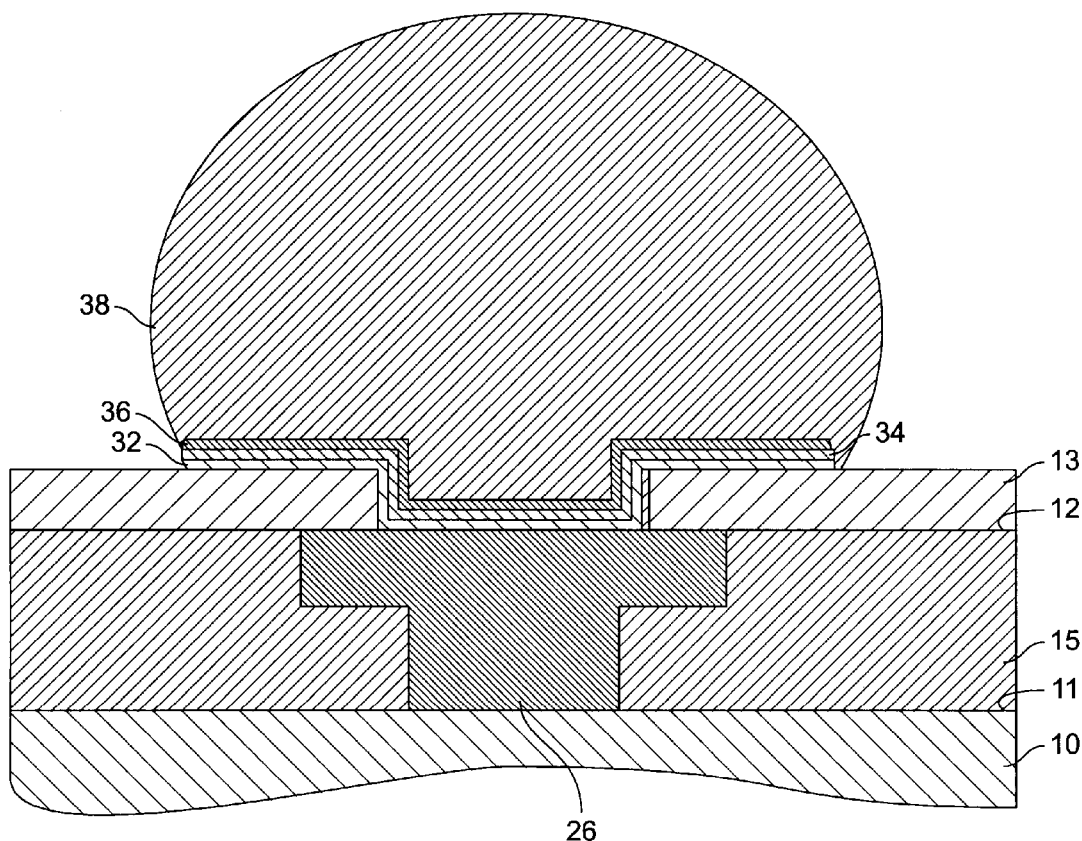
FIG. 1 is an a cross-sectional schematic view of a triple layer Ni/Pd/Au metal stack formed upon a copper metal interconnect layer on a bond pad of an integrated circuit, along with a gold bump secured thereto, in accordance with the present invention.

FIG. 1 shows a cross-sectional view of an integrated circuit structure formed in accordance with the present invention. Semiconductor wafer 10 (the complete thickness of which is not visible in FIG. 1) is preferably a silicon wafer having an upper surface 11. Region 26 designates a copper interconnect metal region forming a connection pad; while connection pad 26 is shown as being made of copper, the interconnect metal could also be aluminum. Region 26 is surrounded by intermetal dielectric layer 15 which insulates interconnect metal conductors (like copper connection pad 26) from each other. A silicon passivation layer 13 is formed above the upper surface 12 of intermetal dielectric layer 15; as shown, a via or window is formed through silicon passivation layer 13 above copper connection pad 26.

Figure 2:
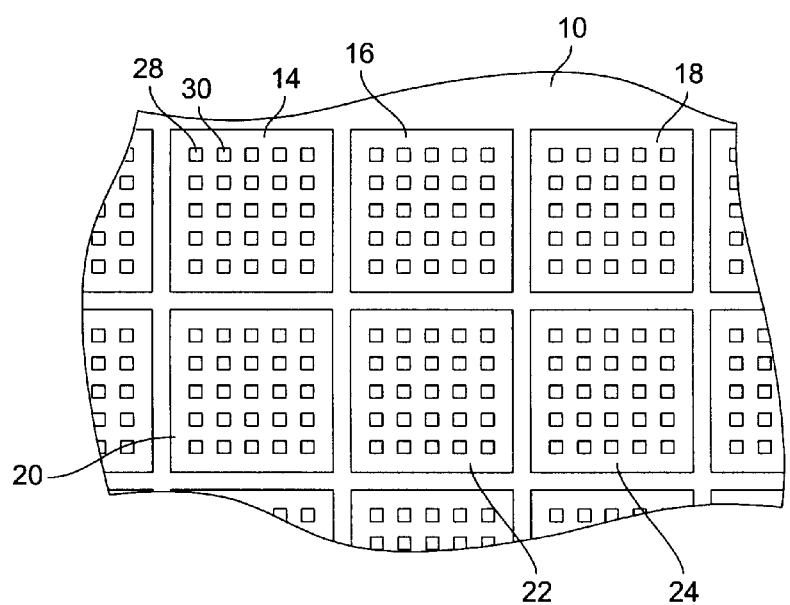
FIG. 2 is a partial top view of a semiconductor wafer illustrating identical integrated circuits formed upon such wafer, and further showing a series of connection pads formed upon each such integrated circuit.

Referring briefly to FIG. 2, semiconductor wafer 10 includes a number of identical integrated circuit die formed thereupon, including integrated circuit die 14, 16, 18, 20, 22, and 24. Each of these integrated circuit die have a series of semiconductor devices, such as MOS transistors (not shown), formed therein upon the surface 12 of semiconductor wafer 10 to form logic switches or other circuit components of an electronic circuit. Each such semiconductor device has two or more electrodes, or terminals (not shown), that need to be electrically interconnected with another circuit element, such as a power supply conductor, or perhaps the output terminal of a previous switch. In order to make such interconnections, one or more patterned layers of interconnect metal are applied over the upper surface 11 of semiconductor wafer 10; where two or more of such interconnect metal layers are used, an insulating layer, such as an oxide layer, is formed over the lower interconnect layer to insulate the upper interconnect layer therefrom. Through hole vias are formed when necessary to allow the upper interconnect layer to connect with the lower interconnect layer below.

As mentioned above, the metal interconnect layers have long been formed of aluminum, though copper is now being used to enhance the conductivity, reliability and speed of circuitry, especially for very fine line geometries used in advanced generations of integrated circuit technologies. Each integrated circuit includes a series of connection pads for making electrical connection to circuitry external to the integrated circuit. For example, one such connection pad might be coupled to a source of positive voltage, another might be coupled to ground, another might receive an input control signal, and still another might be an output signal. In FIG. 1, one such connection pad is designated by reference numeral 26. Referring to FIG. 2, integrated circuit 14 includes a number of such connection pads, including two pads 28 and 30 that lie adjacent one another. The lowermost portions of such connection pads are initially formed by patterning the interconnect metal layer, which again may be copper, into a series of rectangles, or other shapes, that are not covered by any passivation layer.

In practicing the present invention, one or more wafers are fabricated through metal interconnect. Passivation layer 13 covers the interconnect metal, except for the connection pads 26, at which the interconnect metal (aluminum or copper) is exposed. A patterned layer of nickel is plated over each such connection pad for mechanically and electrically bonding to the underlying metal forming such connection pad. The plated nickel layer is "patterned" in the sense that it conforms to the pattern of the underlying interconnect metal connection pads. In FIG. 1, this nickel layer is identified by reference numeral 32 and is applied to a thickness of approximately 1.5 micrometers.

Nickel layer 32 is preferably applied using an electroless nickel deposition process at the wafer level. The wafers to be processed are placed into a cassette and cleaned using processes well known to those skilled in the art. The cassette of wafers is thereafter placed into a nickel plating tank and agitated. The plating time in the nickel tank is calculated based upon the targeted Ni thickness and the plating rate; the plating rate is a function of the temperature, pH, and nickel concentration. This plating rate can be determined by recording empirical data for known conditions of the temperature, pH, and nickel concentration of the plating bath. After the nickel layer has been plated to a thickness of approximately 0.5 micrometers, the cassette is removed from the nickel bath, and rinsed. It should be noted that the nickel layer is plated directly on top of the copper connection pads formed by the copper metal interconnect, without the need for any intervening layer of titanium or other material. Preferably, the thickness of the plated nickel layer ranges between 0.5 micrometers and 20 micrometers.

Following the creation of the nickel layer over the copper connection pads, the wafers are ready for plating of the palladium layer. In FIG. 1, this palladium layer is identified by reference numeral 34 and is applied to a thickness of approximately 0.1 to 5 micrometers. Palladium layer 34 is preferably applied using an electroless deposition process at the wafer level. The wafers resulting from the nickel plating process described above are thereafter plated with Palladium by placing the wafer cassette into a tank containing a Palladium plating bath. Plating time in the Palladium tank is dependent upon the plating rate and the targeted Palladium thickness; this plating rate is a function of the temperature, pH and palladium concentration., and can be determined by recording empirical data for known conditions of the temperature, pH, and palladium concentration of the plating bath. The thickness of the plated layer of palladium preferably ranges between 0.1 micrometers and 5 micrometers.

Upon removal from the Palladium tank, the cassette is moved to the rinse tank to rinse away any remaining palladium bath solution. The resulting wafers now have a layer of palladium patterned according to the underlying pattern of nickel above each connection pad. As mentioned above, this palladium layer helps to prevent the nickel from diffusing outwardly into the gold during subsequent heating cycles.

The cassette containing the wafers is then placed into a tank containing a Gold plating bath, and is manually agitated for 12 minutes. The plated gold layer preferably has a thickness ranging between 0.03 micrometers and 2 micrometers.

At this point, the wafers have a patterned layer of gold plated over the patterned layer of palladium above each connection pad to facilitate the joinder of such connection pad with a connection element, such as a gold wire bond, solder ball, gold bump, nickel bump, etc. Referring to FIG. 1, this gold layer is identified by reference numeral 36. Upon removal from the Gold plating bath tank, the cassette is moved to the rinse tank to rinse off any remaining plating bath with cold rinse water. Finally, the resulting wafers are inspected for plating quality.

Because the triple metal stack of nickel, palladium, and gold can be plated over the copper connection pads so precisely in accordance with the method described above, the connection pads can be disposed within 5 micrometers of each other without imposing any process limitations. This allows the connection pads to be placed on a relatively small pitch, thereby facilitating the formation of a large number of connection pads on each integrated circuit die.

The process of the present invention includes the steps of forming such a triple metal stack above each connection pad, first by forming a patterned layer of nickel by electroless plating over each connection pad, then forming a patterned layer of palladium by electroless plating over the patterned layer of nickel, and finally forming a patterned layer of gold by electroless plating over the patterned layer of palladium.

Those skilled in the art will now appreciate that an improved integrated circuit structure has been described which is compatible with both copper and aluminum interconnect metal, and which facilitates the attachment of the integrated circuit connection pads to external circuitry a wide variety of attachment technologies, including gold wire bonds, solder bumps, gold bumps and nickel bumps, and without risk of the nickel layer out-diffusing into the upper gold layer during subsequent heat cycling. For example, within FIG. 1, a gold bump or ball 38 has been affixed to gold layer 36 atop connection pad 26 to facilitate the joinder of such connection pad to a supporting substrate or package. The described electroless plating technique can be practiced at the wafer level, is relatively simple, yet precise, allowing small pitch geometries for tight placement of the connection pads. Moreover, connection pads provided with the aforementioned plated triple metal stack have been found to permit the use of temporary test probes for testing purposes prior to final packaging, but without harm to the connection pads. Those skilled in the art will also appreciate that an improved process has been described for providing such connection pads .

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

We claim:

1. An integrated circuit structure comprising in combination:
   a. a semiconductor wafer having an upper surface, the semiconductor wafer having a plurality of identical die formed therein, each of the identical die having a plurality of semiconductor devices formed therein upon the surface of the semiconductor wafer;
   b. a patterned layer of interconnect metal formed upon the upper surface of the semiconductor wafer for electrically interconnecting the plurality of semiconductor devices formed within each such die, said patterned layer of interconnect metal including connection pads for making electrical connection to circuitry external to the semiconductor wafer;
   c. a patterned layer of nickel plated over each connection pad for mechanically and electrically bonding to the interconnect metal forming such connection pad, the patterned layer of nickel being in direct contact with the underlying connection pads;
   d. a patterned layer of palladium plated over the patterned layer of nickel above each connection pad for preventing the nickel from diffusing outwardly through the palladium during subsequent heating cycles; and
   e. a patterned layer of gold plated over the patterned layer of palladium above each connection pad to facilitate the joinder of such connection pad with a connection element.

2. The integrated circuit structure recited by claim 1 wherein said connection element is a gold bump.

3. The integrated circuit structure recited by claim 1 wherein said connection element is a gold wire bond.

4. The integrated circuit structure recited by claim 1 wherein said connection element is a solder bump.

5. The integrated circuit structure recited by claim 1 wherein said connection element is a nickel bump.

6. The integrated circuit structure recited by claim 1 wherein, upon each of said die, two of said connection pads are disposed within 5 micrometers of each other.

7. The integrated circuit structure recited by claim 1 wherein said patterned layer of nickel has a thickness that lies in the range of 0.5 micrometers and 20 micrometers.

8. The integrated circuit structure recited by claim 1 wherein said patterned layer of palladium has a thickness that lies in the range of 0.1 micrometers and 5 micrometers.

9. The integrated circuit structure recited by claim 1 wherein said patterned layer of gold has a thickness that lies in the range of 0.03 micrometers and 2 micrometers.

10. The integrated circuit structure recited by claim 1 wherein said patterned layer of interconnect metal is formed of copper.

11. The integrated circuit structure recited by claim 1 wherein said patterned layer of interconnect metal is formed of aluminum.

12. A process for forming connection pads on a plurality of integrated circuit die formed in a semiconductor wafer, the semiconductor wafer having an upper surface, each of the integrated circuit die having a plurality of semiconductor devices formed therein upon the surface of the semiconductor wafer, said process including the steps of:

a. forming a patterned layer of interconnect metal upon the upper surface of the semiconductor wafer for electrically interconnecting the plurality of semiconductor devices formed within each such integrated circuit die, said patterned layer of interconnect metal including connection pads for making electrical connection to circuitry external to the semiconductor wafer;

b. following step a., forming a patterned layer of nickel by electroless plating over each connection pad for mechanically and electrically bonding to the interconnect metal at each such connection pad, the patterned layer of nickel being in direct contact with the underlying connection pads;

c. following step b., forming a patterned layer of palladium by electroless plating over the patterned layer of nickel above each connection pad for preventing the nickel from diffusing outwardly through the palladium during subsequent heating cycles; and d. following step c., forming a patterned layer of gold by electroless plating over the patterned layer of palladium above each connection pad to facilitate the joinder of such connection pad with a connection element.

13. The process recited by claim 12 including the further step of joining a gold bump to the patterned layer of gold above at least one of said connection pads.

14. The process recited by claim 12 including the further step of joining a gold wire bond to the patterned layer of gold above at least one of said connection pads.

15. The process recited by claim 12 including the further step of joining a solder bump to the patterned layer of gold above at least one of said connection pads.

16. The process recited by claim 12 including the further step of joining a nickel bump to the patterned layer of gold above at least one of said connection pads.

17. The process recited by claim 13 wherein the patterned layer of nickel is plated directly on top of the patterned layer of copper metal at each connection pad.

18. The process recited by claim 12 wherein, upon each of said integrated circuit die, at least two of the connection pads are formed within 5 micrometers of each other.

19. The process recited by claim 12 wherein said step of forming a patterned layer of nickel produces a nickel layer having a thickness that lies in the range of 0.5 micrometers and 20 micrometers.

20. The process recited by claim 12 wherein said step of forming a patterned layer of palladium produces a palladium layer having a thickness that lies in the range of 0.1 micrometers and 5 micrometers.

21. The process recited by claim 12 wherein said step of forming a patterned layer of gold produces a gold layer having a thickness that lies in the range of 0.03 micrometers and 2 micrometers.

22. The process recited by claim 12 wherein said step of forming a patterned layer of interconnect metal upon the upper surface of the semiconductor wafer for electrically interconnecting the plurality of semiconductor devices includes the step of forming such patterned layer of interconnect metal from the metal copper.

23. The process recited by claim 12 wherein said process includes the further step of heating the semiconductor wafer following the step of forming the patterned layer of gold in order to thermal cycle the plurality of semiconductor devices formed within each such integrated circuit die.

* * * * *

(12) EX PARTE REEXAMINATION CERTIFICATE (9808th)
United States Patent
Ling et al.

(10) Number: US 6,445,069 C1
(45) Certificate Issued: Aug. 21, 2013

(54) ELECTROLESS NI/PD/AU METALLIZATION STRUCTURE FOR COPPER INTERCONNECT SUBSTRATE AND METHOD THEREFOR

(75) Inventors: Jamin Ling, Scottsdale, AZ (US); Dave Charles Stepniak, Phoenix, AZ (US)

(73) Assignee: Wells Fargo Bank, National Association, Phoenix, AZ (US)

Reexamination Request:
No. 90/012,302, May 22, 2012

Reexamination Certificate for:
Patent No.: 6,445,069
Issued: Sep. 3, 2002
Appl. No.: 09/766,798
Filed: Jan. 22, 2001

(51) Int. Cl.
*H01L 23/48* (2006.01)
*H01L 21/288* (2006.01)
*H01L 21/60* (2006.01)
*H01L 23/485* (2006.01)
*H01L 21/02* (2006.01)

(52) U.S. Cl.
USPC ............ 257/738; 257/E21.508; 257/E23.021; 257/762; 257/E21.174

(58) Field of Classification Search
None
See application file for complete search history.

(56) References Cited

To view the complete listing of prior art documents cited during the proceeding for Reexamination Control Number 90/012,302, please refer to the USPTO's public Patent Application Information Retrieval (PAIR) system under the Display References tab.

*Primary Examiner* — Yuzhen Ge

(57) ABSTRACT

A nickel/palladium/gold metallization stack is formed upon connection pads of integrated circuits at the wafer level through an electroless plating method. The metallization stack can be formed over copper or aluminum interconnect pads; the lower nickel layer bonds securely to the copper or aluminum interconnect pads, while the intermediate palladium layer serves as a diffusion barrier for preventing the nickel from out-diffusing during subsequent thermal cycles. The upper gold layer adheres to the palladium and readily receives a variety of interconnect elements, including gold bumps, gold wire bonds, solder bumps, and nickel bumps. The electroless plating process permits connection pads to be formed using fine geometries, and allows adjacent connection pads to be formed within 5 micrometers of each other.

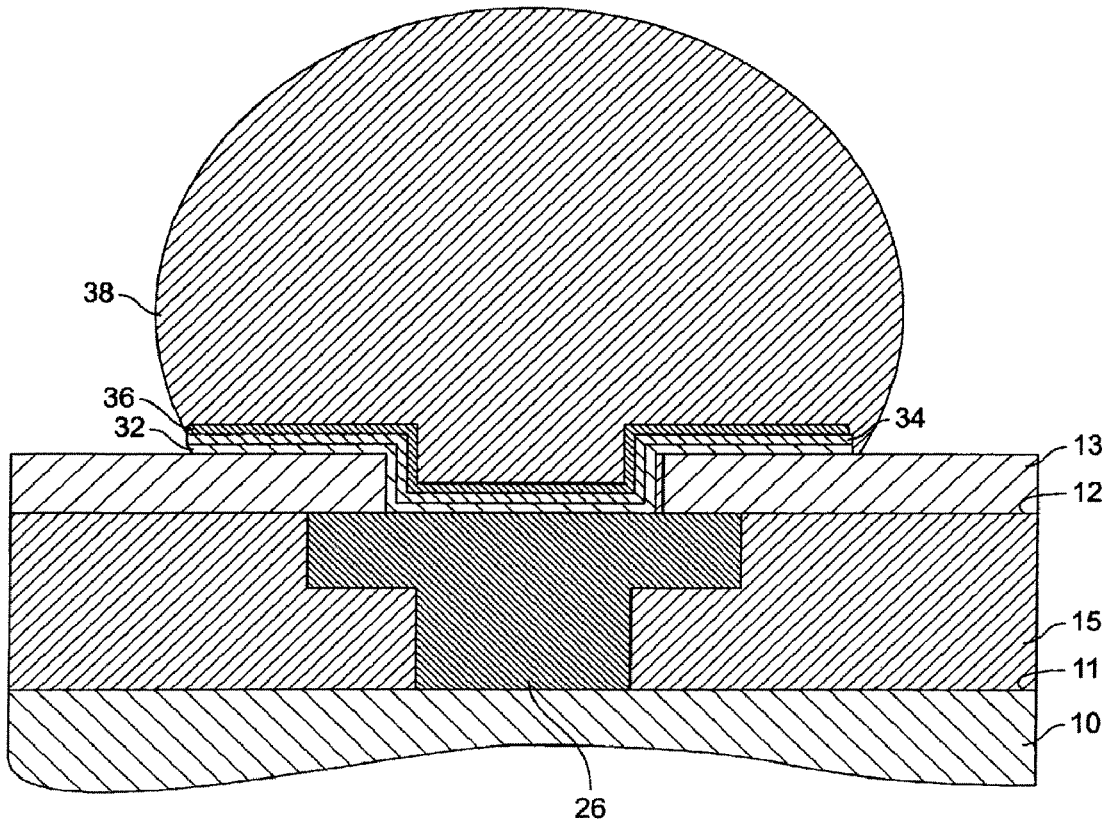

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 10-11, 17 and 22 are cancelled.

Claims 1 and 12 are determined to be patentable as amended.

Claims 2-9, 13-16, 18-21 and 23, dependent on an amended claim, are determined to be patentable.

New claims 24-35 are added and determined to be patentable.

1. An integrated circuit structure comprising in combination:
   a. a semiconductor wafer having an upper surface, the semiconductor wafer having a plurality of identical die formed therein, each of the identical die having a plurality of semiconductor devices formed therein upon the surface of the semiconductor wafer;
   b. a patterned layer of interconnect metal formed upon the upper surface of the semiconductor wafer for electrically interconnecting the plurality of semiconductor devices formed within each such die, said patterned layer of interconnect metal including connection pads for making electrical connection to circuitry external to the semiconductor wafer;
   c. a patterned layer of nickel plated over each connection pad for mechanically and electrically bonding to the interconnect metal forming such connection pad, the patterned layer of nickel being in direct contact with the underlying connection pads;
   d. a patterned layer of palladium plated over the patterned layer of nickel above each connection pad for preventing the nickel from diffusing outwardly through the palladium during subsequent heating cycles; and
   e. a patterned layer of gold plated over the patterned layer of palladium above each connection pad to facilitate the joinder of such connection pad with a connection element*;*
   *wherein said patterned layer of interconnect metal is formed of aluminum.*

12. A process for forming connection pads on a plurality of integrated circuit die formed in a semiconductor wafer, the semiconductor wafer having an upper surface, each of the integrated circuit die having a plurality of semiconductor devices formed therein upon the surface of the semiconductor wafer, said process including the steps of:
    a. forming a patterned layer of interconnect metal upon the upper surface of the semiconductor wafer for electrically interconnecting the plurality of semiconductor devices formed within each such integrated circuit die, said patterned layer of interconnect metal including connection pads for making electrical connection to circuitry external to the semiconductor wafer;
    *wherein said patterned layer of interconnect metal is formed of aluminum*
    b. following step a., forming a patterned layer of nickel by electroless plating over each connection pad for mechanically and electrically bonding to the interconnect metal at each such connection pad, the patterned layer of nickel being in direct contact with the underlying connection pads;
    c. following step b., forming a patterned layer of palladium by electroless plating over the patterned layer of nickel above each connection pad for preventing the nickel from diffusing outwardly through the palladium during subsequent heating cycles; and
    d. following step c., forming a patterned layer of gold by electroless plating over the patterned layer of palladium above each connection pad to facilitate the joinder of such connection pad with a connection element.

*24. The integrated circuit structure of claim 1, comprising:*
*a dielectric layer surrounding the patterned layer of interconnect metal formed of aluminum.*

*25. The integrated circuit structure of claim 24, wherein the patterned layer of interconnect metal formed of aluminum is a first lower patterned layer of aluminum interconnect metal, wherein the integrated circuit structure comprises:*
*a second upper patterned layer of interconnect metal above the first lower patterned layer of aluminum interconnect metal; and*
*an insulating oxide layer between the first lower patterned layer of aluminum interconnect metal and the second upper patterned layer of interconnect metal.*

*26. The integrated circuit structure of claim 24, wherein the patterned layer of aluminum interconnect metal is in the form of a rectangle.*

*27. The integrated circuit structure of claim 25 or claim 26, wherein the patterned layer of nickel has a thickness of 1.5 micrometers.*

*28. The process of claim 12, comprising:*
*prior to step b, placing the semiconductor wafer in a cassette; and wherein step b comprises:*
*placing the cassette into an electroless nickel plating tank and then completing the forming a patterned layer of nickel step via an electroless nickel plating bath.*

*29. The process of claim 28, wherein step c comprises:*
*placing the cassette into an electroless palladium plating tank and then completing the forming a patterned layer of palladium step via an electroless palladium plating bath.*

*30. The process of claim 29, wherein step d comprises:*
*placing the cassette into an electroless gold plating tank and then completing the forming a patterned layer of gold step via an electroless gold plating bath.*

*31. The process of claim 30, wherein the forming a patterned layer of gold step comprises maintaining the cassette in the electroless gold plating bath for 12 minutes.*

*32. The process of claim 31, wherein the forming a patterned layer of gold step comprises manually agitating the electroless gold plating bath during the 12 minutes.*

*33. The process of any of claims 12, 30 and 32, comprising:*
*after step d, using a temporary test probe to test at least some of the connection pads prior to final packaging.*

*34. An integrated circuit structure comprising in combination:*
*a. a semiconductor wafer having an upper surface, the semiconductor wafer having a plurality of identical die formed therein, each of the identical die having a plurality of semiconductor devices formed therein upon the surface of the semiconductor wafer;* b. a patterned layer of interconnect metal formed upon the upper surface of the semiconductor wafer for electrically interconnecting the plurality of semiconductor devices formed within each such die, said patterned layer of interconnect metal including connection pads for making electrical connection to circuitry external to the semiconductor wafer;

c. a patterned layer of nickel plated over each connection pad for mechanically and electrically bonding to the interconnect metal forming such connection pad, the patterned layer of nickel being in direct contact with the underlying connection pads;

d. a patterned layer of palladium plated over the patterned layer of nickel above each connection pad for preventing the nickel from diffusing outwardly through the palladium during subsequent heating cycles; and e. a patterned layer of gold plated over the patterned layer of palladium above each connection pad to facilitate the joinder of such connection pad with a connection element, wherein, upon each of said die, two of said connection pads are disposed within 5 micrometers of each other.

35. A process for forming connection pads on a plurality of integrated circuit die formed in a semiconductor wafer, the semiconductor wafer having an upper surface, each of the integrated circuit die having a plurality of semiconductor devices formed therein upon the surface of the semiconductor wafer, said process including the steps of:

a. forming a patterned layer of interconnect metal upon the upper surface of the semiconductor wafer for electrically interconnecting the plurality of semiconductor devices formed within each such integrated circuit die, said patterned layer of interconnect metal including connection pads for making electrical connection to circuitry external to the semiconductor wafer;

b. following step a., forming a patterned layer of nickel by electroless plating over each connection pad for mechanically and electrically bonding to the interconnect metal at each such connection pad, the patterned layer of nickel being in direct contact with the underlying connection pads;

c. following step b., forming a patterned layer of palladium by electroless plating over the patterned layer of nickel above each connection pad for preventing the nickel from diffusing outwardly through the palladium during subsequent heating cycles; and d. following step c., forming a patterned layer of gold by electroless plating over the patterned layer of palladium above each connection pad to facilitate the joinder of such connection pad with a connection element;

wherein, upon each of said integrated circuit die, at least two of the connection pads are formed within 5 micrometers of each other.

\* \* \* \* \*

(12) EX PARTE REEXAMINATION CERTIFICATE (10456th)

United States Patent
Ling et al.

(10) Number: US 6,445,069 C2
(45) Certificate Issued: Dec. 29, 2014

(54) ELECTROLESS NI/PD/AU METALLIZATION STRUCTURE FOR COPPER INTERCONNECT SUBSTRATE AND METHOD THEREFOR

(75) Inventors: Jamin Ling, Scottsdale, AZ (US); Dave Charles Stepniak, Phoenix, AZ (US)

(73) Assignee: Wells Fargo Bank, National Association, Phoenix, AZ (US)

Reexamination Request:
No. 90/013,137, Jan. 27, 2014

Reexamination Certificate for:
Patent No.: 6,445,069
Issued: Sep. 3, 2002
Appl. No.: 09/766,798
Filed: Jan. 22, 2001

Reexamination Certificate C1 6,445,069 issued Aug. 21, 2013

(51) Int. Cl.
*H01L 23/48* (2006.01)
(52) U.S. Cl.
USPC .......................................... 257/738; 257/762

(58) Field of Classification Search
None
See application file for complete search history.

(56) References Cited

To view the complete listing of prior art documents cited during the proceeding for Reexamination Control Number 90/013,137, please refer to the USPTO's public Patent Application Information Retrieval (PAIR) system under the Display References tab.

*Primary Examiner* — My Trang Nu Ton

(57) ABSTRACT

A nickel/palladium/gold metallization stack is formed upon connection pads of integrated circuits at the wafer level through an electroless plating method. The metallization stack can be formed over copper or aluminum interconnect pads; the lower nickel layer bonds securely to the copper or aluminum interconnect pads, while the intermediate palladium layer serves as a diffusion barrier for preventing the nickel from out-diffusing during subsequent thermal cycles. The upper gold layer adheres to the palladium and readily receives a variety of interconnect elements, including gold bumps, gold wire bonds, solder bumps, and nickel bumps. The electroless plating process permits connection pads to be formed using fine geometries, and allows adjacent connection pads to be formed within 5 micrometers of each other.

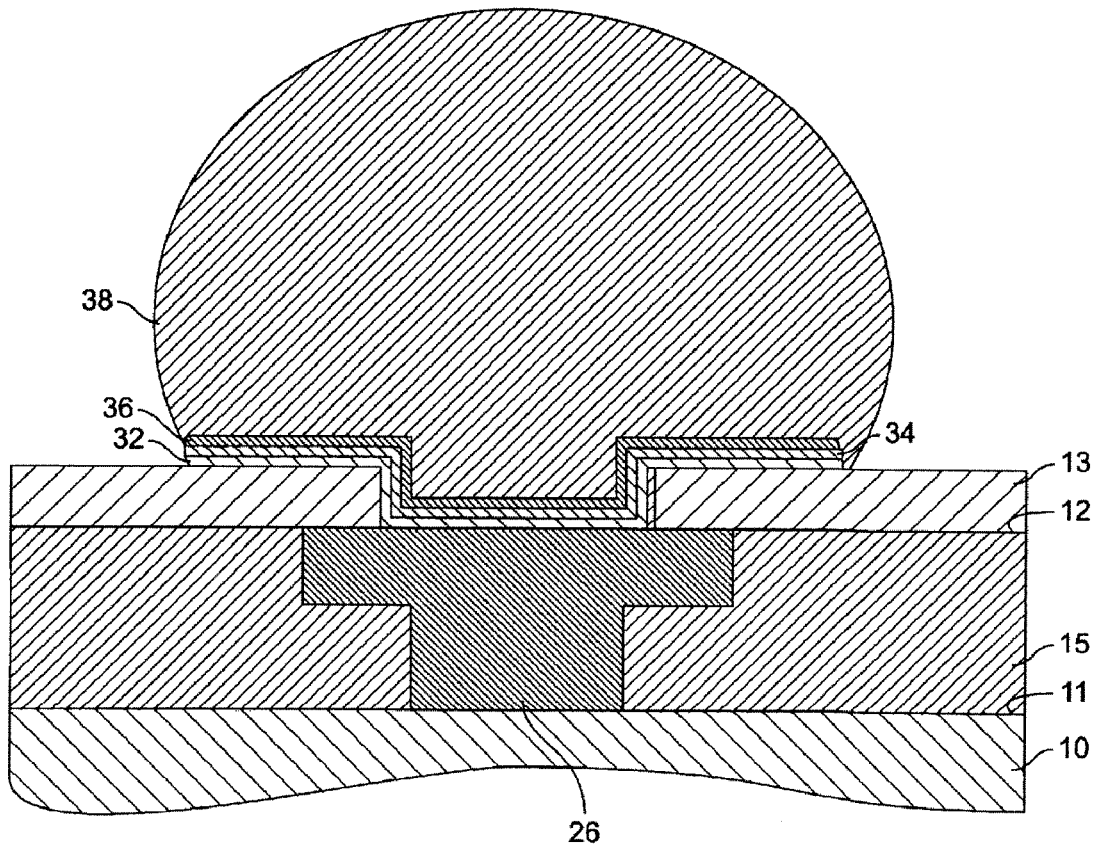

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 34 and 35 is confirmed.

Claims 10, 11, 17 and 22 were previously cancelled.

Claims 6 and 18 are cancelled.

Claims 1-5, 7-9, 12-16, 19-21, 23, 27-28 and 33 are determined to be patentable as amended.

Claims 24-26 and 29-32, dependent on an amended claim, are determined to be patentable.

New claims 36-38 are added and determined to be patentable.

1. An integrated circuit structure comprising in combination:
   a. a semiconductor wafer having an upper surface, the semiconductor wafer having a plurality of identical die formed therein, each of the identical die having a plurality of semiconductor devices formed therein upon the surface of the semiconductor wafer;
   b. a patterned layer of interconnect metal formed upon the upper surface of the semiconductor wafer for electrically interconnecting the plurality of semiconductor devices formed within each such die, said patterned layer of interconnect metal including connection pads for making electrical connection to circuitry external to the semiconductor wafer;
   c. a patterned layer of nickel plated over each connection pad for mechanically and electrically bonding to the interconnect metal forming such connection pad, the patterned layer of nickel being in direct contact with the underlying connection pads;
   d. a patterned layer of palladium plated over the patterned layer of nickel above each connection pad for preventing the nickel from diffusing outwardly through the palladium during subsequent heating cycles; and
   e. a patterned layer of gold plated over the patterned layer of palladium above each connection pad to facilitate the joinder of such connection pad with a connection element;
   wherein said patterned layer of interconnect metal is formed of aluminum;
   *wherein, upon each of said die, two of said connection pads are disposed within 5 micrometers of each other.*

2. The integrated circuit structure recited by [claim] *any one of claims* 1 *or 34* wherein said connection element is a gold bump.

3. The integrated circuit structure recited by [claim] *any one of claims* 1 *or 34* wherein said connection element is a gold wire bond.

4. The integrated circuit structure recited by [claim] *any one of claims* 1 *or 34* wherein said connection element is a solder bump.

5. The integrated circuit structure recited by [claim] *any one of claims* 1 *or 34* wherein said connection element is a nickel bump.

7. The integrated circuit structure recited by [claim] *any one of claims* 1 *or 34* wherein said patterned layer of nickel has a thickness that lies in the range of 0.5 micrometers and 20 micrometers.

8. The integrated circuit structure recited by [claim] *any one of claims* 1 *or 34* wherein said patterned layer of palladium has a thickness that lies in the range of 0.1 micrometers and 5 micrometers.

9. The integrated circuit structure recited by [claim] *any one of claims* 1 *or 34* wherein said patterned layer of gold has a thickness that lies in the range of 0.03 micrometers and 2 micrometers.

12. A process for forming connection pads on a plurality of integrated circuit die formed in a semiconductor wafer, the semiconductor wafer having an upper surface, each of the integrated circuit die having a plurality of semiconductor devices formed therein upon the surface of the semiconductor wafer, said process including the steps of:
    a. forming a patterned layer of interconnect metal upon the upper surface of the semiconductor wafer for electrically interconnecting the plurality of semiconductor devices formed within each such integrated circuit die, said patterned layer of interconnect metal including connection pads for making electrical connection to circuitry external to the semiconductor wafer;
    wherein said patterned layer of interconnect metal is formed of aluminum
    b. following step a., forming a patterned layer of nickel by electroless plating over each connection pad for mechanically and electrically bonding to the interconnect metal at each such connection pad, the patterned layer of nickel being in direct contact with the underlying connection pads;
    c. following step b., forming a patterned layer of palladium by electroless plating over the patterned layer of nickel above each connection pad for preventing the nickel from diffusing outwardly through the palladium during subsequent heating cycles; and
    d. following step c., forming a patterned layer of gold by electroless plating over the patterned layer of palladium above each connection pad to facilitate the joinder of such connection pad with a connection element;
    *wherein, upon each of said integrated circuit die, at least two of the connection pads are formed within 5 micrometers of each other.*

13. The process recited by [claim] *any one of claims* 12 *or 35* including the further step of joining a gold bump to the patterned layer of gold above at least one of said connection pads.

14. The process recited by [claim] *any one of claims* 12 *or 35* including the further step of joining a gold wire bond to the patterned layer of gold above at least one of said connection pads.

15. The process recited by [claim] *any one of claims* 12 *or 35* including the further step of joining a solder bump to the patterned layer of gold above at least one of said connection pads.

16. The process recited by [claim] *any one of claims* 12 *or 35* including the further step of joining a nickel bump to the patterned layer of gold above at least one of said connection pads.

19. The process recited by [claim] *any one of claims* 12 *or 35* wherein said step of forming a patterned layer of nickel produces a nickel layer having a thickness that lies in the range of 0.5 micrometers and 20 micrometers.

20. The process recited by [claim] *any one of claims* 12 *or 35* wherein said step of forming a patterned layer of palladium produces a palladium layer having a thickness that lies in the range of 0.1 micrometers and 5 micrometers.

21. The process recited by [claim] *any one of claims* 12 *or 35* wherein said step of forming a patterned layer of gold produces a gold layer having a thickness that lies in the range of 0.03 micrometers and 2 micrometers.

23. The process recited by [claim] *any one of claims* 12 *or 35* wherein said process includes the further step of heating the semiconductor wafer following the step of forming the patterned layer of gold in order to thermal cycle the plurality of semiconductor devices formed within each such integrated circuit die.

27. The integrated circuit structure of claim 25 or claim 26 or claim *37 or claim 38*, wherein the patterned layer of nickel has a thickness of 1.5 micrometers.

28. The process of [claim] *any one of claims* 12 *or 35*, comprising:

prior to step b, placing the semiconductor wafer in a cassette; and wherein step b comprises:

placing the cassette into an electroless nickel plating tank and then completing the forming a patterned layer of nickel step via an electroless nickel plating bath.

33. The process of any of claims 12, 30 [and], 32, *and 35* comprising:

after step d, using a temporary test probe to test at least some of the connection pads prior to final packaging.

*36. The integrated circuit structure of claim 34, comprising:*

*a dielectric layer surrounding the patterned layer of interconnect metal.*

*37. The integrated circuit structure of claim 36, wherein the patterned layer of interconnect metal is a first lower patterned layer of interconnect metal, wherein the integrated circuit structure comprises:*

*a second upper patterned layer of interconnect metal above the first lower patterned layer of interconnect metal; and*

*an insulating oxide layer between the first lower patterned layer of interconnect metal and the second upper patterned layer of interconnect metal.*

*38. The integrated circuit structure of claim 36, wherein the patterned layer of interconnect metal is in the form of a rectangle.*

\* \* \* \* \*